(12) United States Patent
VanBuskirk et al.

(10) Patent No.: US 8,098,521 B2
(45) Date of Patent: Jan. 17, 2012

(54) METHOD OF PROVIDING AN ERASE ACTIVATION ENERGY OF A MEMORY DEVICE

(75) Inventors: Michael A. VanBuskirk, Saratoga, CA (US); Colin S. Bill, Cupertino, CA (US); Zhida Lan, Cupertino, CA (US); Tzu-Ning Fang, Palo Alto, CA (US)

(73) Assignee: Spansion LLC, Sunnyvale, CA (US)

( * ) Notice: Subject to any disclaimer, the term of this patent is extended or adjusted under 35 U.S.C. 154(b) by 1564 days.

(21) Appl. No.: 11/095,849

(22) Filed: Mar. 31, 2005

(65) Prior Publication Data

US 2006/0221713 A1    Oct. 5, 2006

(51) Int. Cl.
*G11C 11/34* (2006.01)

(52) U.S. Cl. .......... 365/175; 365/72; 365/148; 365/184; 365/243

(58) Field of Classification Search ................ 257/2, 3, 257/209; 365/151, 175, 189.01
See application file for complete search history.

(56) References Cited

U.S. PATENT DOCUMENTS

| 7,145,824 | B2 * | 12/2006 | Bill et al. .................. 365/212 |
| 7,379,317 | B2 * | 5/2008 | Bill et al. .................... 365/72 |
| 7,450,416 | B1 * | 11/2008 | Kaza et al. ................. 365/175 |
| 7,564,708 | B2 * | 7/2009 | Fang et al. .................. 365/148 |
| 2003/0053350 | A1 * | 3/2003 | Krieger et al. ............ 365/200 |
| 2003/0173612 | A1 * | 9/2003 | Krieger et al. ............ 257/304 |
| 2004/0026729 | A9 * | 2/2004 | Krieger et al. ............ 257/306 |
| 2004/0084743 | A1 * | 5/2004 | VanBuskirk et al. ...... 257/481 |
| 2004/0102038 | A1 * | 5/2004 | Oglesby ..................... 438/674 |
| 2004/0245522 | A1 * | 12/2004 | VanBuskirk et al. ........ 257/40 |
| 2006/0104111 | A1 * | 5/2006 | Tripsas et al. ............. 365/175 |
| 2006/0139994 | A1 * | 6/2006 | Bill et al. .................. 365/175 |

* cited by examiner

*Primary Examiner* — Anh Mai

(57) ABSTRACT

A write-once read-many times memory device is made up of first and second electrodes, a passive layer between the first and second electrodes, and an active layer between the first and second electrode. The memory device is programmed by providing a charged species from the passive layer into the active layer. The memory device may be programmed to have for the programmed memory device a first erase activation energy. The present method provides for the programmed memory device a second erase activation energy greater than the first erase activation energy.

3 Claims, 4 Drawing Sheets

METHOD OF PROVIDING AN ERASE ACTIVATION ENERGY OF A MEMORY DEVICE

BACKGROUND OF THE INVENTION

1. Technical Field

This invention relates generally to memory devices, and more particularly, to a write-once read-many times memory.

2. Background Art

A write-once read-many times memory is a storage medium to which data can be written only a single time, but can be read a large number of times. Such a storage medium provides substantially longer "shelf life" than a magnetic storage medium, and thus is highly useful when data must be preserved for a long time. Typically, such a memory takes the form of an optical disk, for example, a compact disc on which data is permanently etched during the write process. In addition to long data retention, is desirable that the memory provides high density and low power usage, accompanied by fast write and read speeds.

While this form of write-once read-many times memory has proven advantageous, it will be understood that improvements in data density, power usage, and write and read speeds is constantly being sought.

FIG. 1 illustrates a programmable and erasable memory device 30. The memory device 30 includes a Cu electrode 32, a $Cu_2S$ passive layer 34 on the electrode 32, a $Cu_2O$ active layer 36 on the layer 34, and a Ti electrode 38 on the active layer 36. Initially, assuming that the memory device 30 is unprogrammed, in order to program the memory device 30, an increasingly negative voltage is applied to the electrode 38, while the electrode 32 is held at ground, so that an increasing electrical potential is applied across the memory device 30 from a higher to a lower potential in the direction from electrode 32 to electrode 38, until electrical potential $V_{pg}$ (the electrical potential required to program the memory device 30) is reached (see FIG. 2, a plot of memory device current vs. electrical potential applied across the memory device 30). This potential $V_{pg}$ is sufficient to cause copper ions to be attracted from the superionic layer 34 toward the electrode 38 and into the active layer 36, causing the active layer 36 (and the overall memory device 30) to switch to a low-resistance or conductive state (A). Upon removal of such potential (B), the copper ions drawn into the active layer 36 during the programming step remain therein, so that the active layer 36 (and memory device 30) remain in a conductive or low-resistance state, as indicated by the resistance characteristic (B).

In order to erase the prior art memory device (FIG. 2), an increasingly positive voltage is applied to the electrode 38, while the electrode 32 is held at ground, so that an increasing electrical potential is applied until electrical potential $V_{er}$ (the "erase" electrical potential) is applied across the memory device 30 from a higher to a lower electrical potential in the reverse direction. With bonding between the copper ions and the active layer not being strong, this potential $V_{er}$ is sufficient to cause copper ions to be repelled from the active layer 36 toward the electrode 32 and into the superionic layer 34 (C), in turn causing the active layer 36 (and the overall memory device 30) to be in a high-resistance or substantially non-conductive state. This state remains upon removal of such potential from the memory device 30.

FIG. 2 also illustrates the read step of the memory device 30 in its programmed (conductive) state and in its erased (nonconductive) state. An electrical potential $V_r$ (the "read" electrical potential) is applied across the memory device 30 from a higher to a lower electrical potential in the same direction as the electrical potential $V_{pg}$. This electrical potential is less than the electrical potential $V_{pg}$ applied across the memory device 30 for programming (see above). In this situation, if the memory device 30 is programmed, the memory device 30 will readily conduct current (level L1), indicating that the memory device 30 is in its programmed state. If the memory device 30 is erased, the memory device 30 will not conduct current (level L2), indicating that the memory device 30 is in its erased state.

Reference is made to the paper THEORY OF COPPER VACANCY IN CUPROUS OXIDE by A. F. Wright and J. S. Nelson, Journal of Applied Physics, Volume 92, Number 10, pages 5849-5851, Nov. 15, 2002, which is hereby incorporated by reference. That paper describes the process of diffusion of copper ions through $Cu_2O$. In the diffusion process, typically involving a vacancy mechanism wherein atoms jump from a first (atom) state to a second (vacancy) state, atoms need energy to break bonds with neighbors and to provide necessary distortion of the material between the states. The above-cited paper indicates that the activation energy $E_a$ for moving a copper ion from one state to the next in the $Cu_2O$ is approximately 0.3 eV. FIG. 3, a graph illustrating this movement, shows movement (arrow F) from state 1 (unprogrammed) to state 2 (programmed). In such process, the activation energy is indicated by the arrow $E_{a1}$. FIG. 4 illustrates movement (arrow G) from state 2 (programmed) to state 1 (unprogrammed). In such process, the activation energy is indicated by the arrow $E_{2a}$. With the relatively low activation energy $E_{a2}$ required to move copper ions and from state 2 (programmed) to state 1 (unprogrammed), programmed data may be easily lost.

This type of memory device provides many advantages, in particular, very high density, low power requirements, and very fast read and write capabilities. However, the memory device 30 as described, being readily erased, is not intended to meet the specification of a write-once read-many times memory.

What is needed a memory device which includes the advantages of the memory device 30 described above, i.e., high density, low power usage, and high read and write speeds, meanwhile being a write-once read-many times memory.

DISCLOSURE OF THE INVENTION

Broadly stated, in the present method of undertaking an operation on a memory device, the memory device comprises first and second electrodes, a passive layer between the first and second electrodes, and an active layer between the first and second electrode. The memory device is programmed by providing a charged species from the passive layer into the active layer. The memory device may be programmed to have for the programmed memory device a first erase activation energy. The method comprises providing for the programmed memory device a second, increased erase activation energy.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

BEST MODE(S) FOR CARRYING OUT THE INVENTION

Reference is now made in detail to specific embodiments of the present invention which illustrate the best mode presently contemplated by the inventors for practicing the invention.

Figure 5:
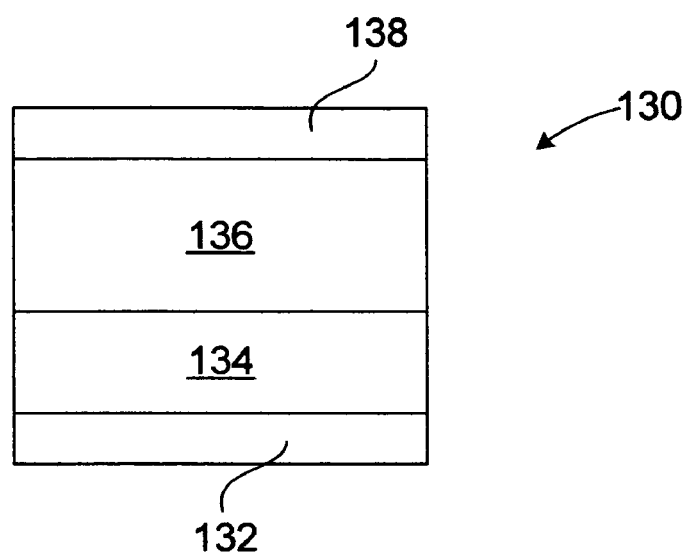
FIG. 5 is a cross-sectional view of the present memory device.

FIG. 5 illustrates the present memory device 130, similar to the previously described memory device 30. As such, the memory device 130 includes a Cu electrode 132, a copper sulfide passive layer 134 ($Cu_xS$ where $1.75<X<2$) over and on the electrode 132, an active layer 136 over and on the passive layer 134, and a Ti electrode 138 over and on the active layer 136, so that the passive and active layers 134, 136 are between the electrodes 132, 138. The active layer 136 may be an inorganic dielectric material such $Cu_2O$, $SiO_2$, $Ta_2O_5$, $WO_3$, $TiO_2$, or $SiON$, an organic dielectric layer such as polyimide, poly(arylene ether), benzocyclobutene, and parylene-F, an organic low conductive semiconductor material such as poly(phenylene), poly(pyridine), poly(para-phenylene vinylene), polyacetylene, and polyprrole, and mixtures of any of these inorganic and organic materials.

Figure 4:
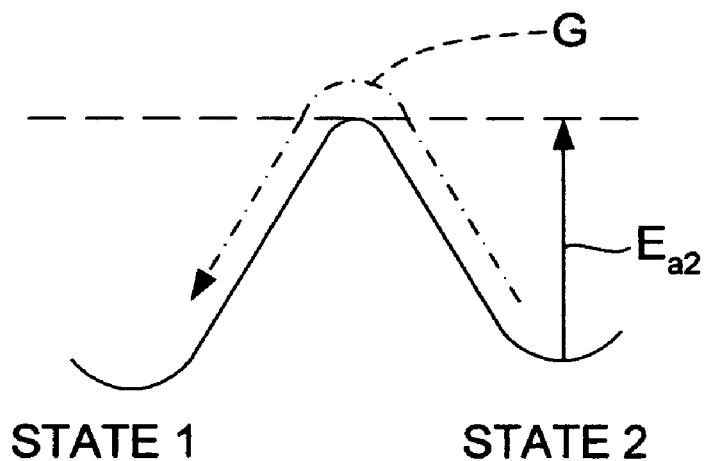
Figure 6:
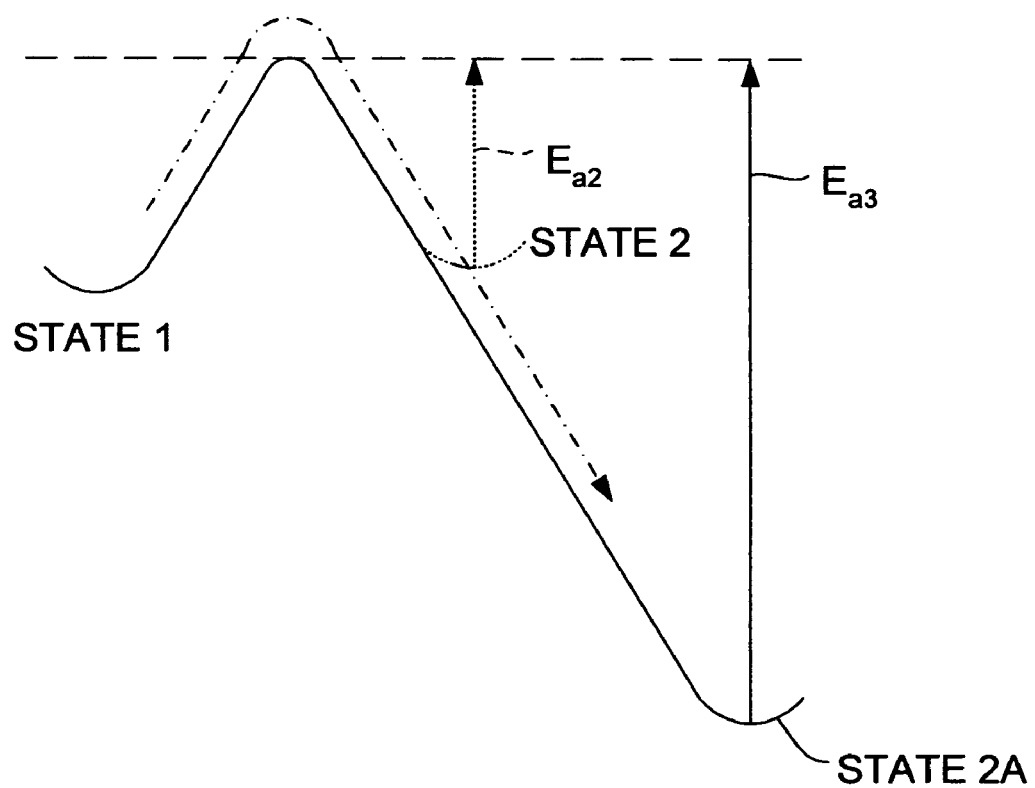
FIG. 6 is a graph illustrating the present method.

In a first embodiment, in programming the present memory device 130, an increasingly negative voltage is applied to the electrode 138, while the electrode 132 is held at ground, so that an increasing electrical potential is applied across the memory device 130 from a higher to a lower potential in the direction from electrode 132 to electrode 138. However, rather than programming the memory device 130 with the electrical potential $V_{pg}$ required to program the memory device as described above, the electrical potential so applied is increased to a level $V_{pg1}$ which is substantially greater than the electrical potential $V_{pg}$. This substantially increased electrical potential $V_{pg1}$ provides more rapid programming of the memory device 130 and is sufficient to cause strong chemical bonding and/or strong ionic bonding between the copper ions and the active layer. As previously described with regard to FIG. 4, and repeated in FIG. 6, the activation energy from the (prior art) state 2 energy level is indicated by the arrow $E_{a2}$. However, in the present approach, with the strong bonding between the copper ions and active layer 136, or sufficient Cu to form a stable metal cluster as a conduction path, the activation energy from the state 2A energy level is greatly increased over the activation energy $E_{a2}$, as indicated by the arrow $E_{a3}$. This greatly increased activation energy in the erase direction greatly inhibits movement of copper ions within and through the active layer 136 from state 2A (programmed state) to state 1 (unprogrammed state) into the passive layer 134. Because of this greatly increased erase energy requirement, once the memory device 130 is programmed, the memory device 130 retains its programmed, conductive, low resistance state over a long period of time so that the programmed state of the memory device 130 can be read many times without loss of data. Thus, the memory device 130 is rapidly programmed, and when so programmed, is in a very stable state that can be read many times over a long period of time.

In another embodiment, when programming the memory device 130, the temperature of the memory device 130 is raised to a level substantially above that of the ambient, for example room temperature by increasing current therethrough and/or increasing programming time. In this situation, when using the original electrical potential $V_{pg}$ to program the memory device 130, the elevated temperature causes strong chemical bonding and/or strong ionic bonding between the copper ions and the active layer 136. Again, with the strong bonding between the copper ions and layer 136, the activation energy from the state 2A energy level is greatly increased when compared to the activation energy from state 2, as indicated by the arrow $E_{a3}$. This greatly increased activation energy in the erase direction greatly inhibits movement of copper ions within and through the active layer 136 from state 2A (programmed state) to state 1 (unprogrammed state) into the passive layer 134. Because of this greatly increased erase energy requirement, once the memory device 130 is programmed, the memory device 130 retains its programmed, conductive, low resistance state over a long period of time so that the programmed state of the memory device 130 can be read many times without loss of data. Thus, the memory device 130 is rapidly programmed, and when so programmed, is in a very stable state that can be read many times over a long period of time.

It will be understood that the methods described above, i.e., increased electric field and increased temperature (due to increased current), can be used simultaneously in combination, if so desired, increasing the efficiency of the method.

It will be understood that the memory device 130 can take different forms. For example, the passive layer can be silver sulfide ($Ag_xS$ where $X\sim 2$), with Ag ions being the charged species involved, or a mixture of copper sulfide and silver sulfide.

Figure 1:
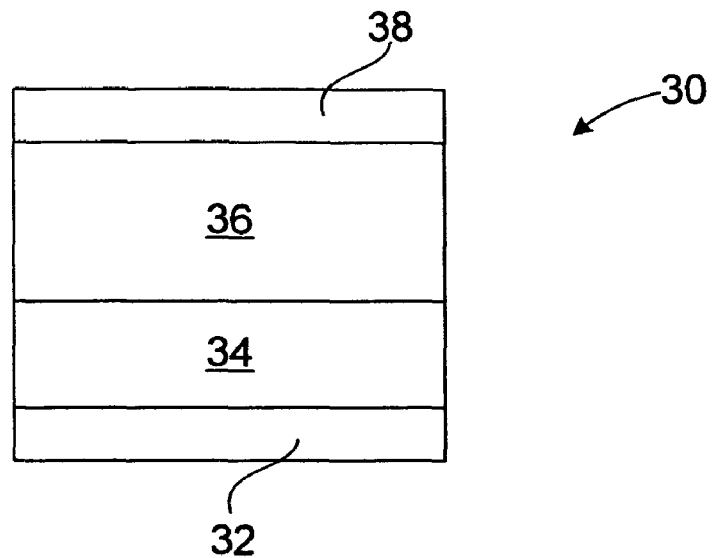
FIG. 1 is a cross-sectional view of a typical memory device.
Figure 2:
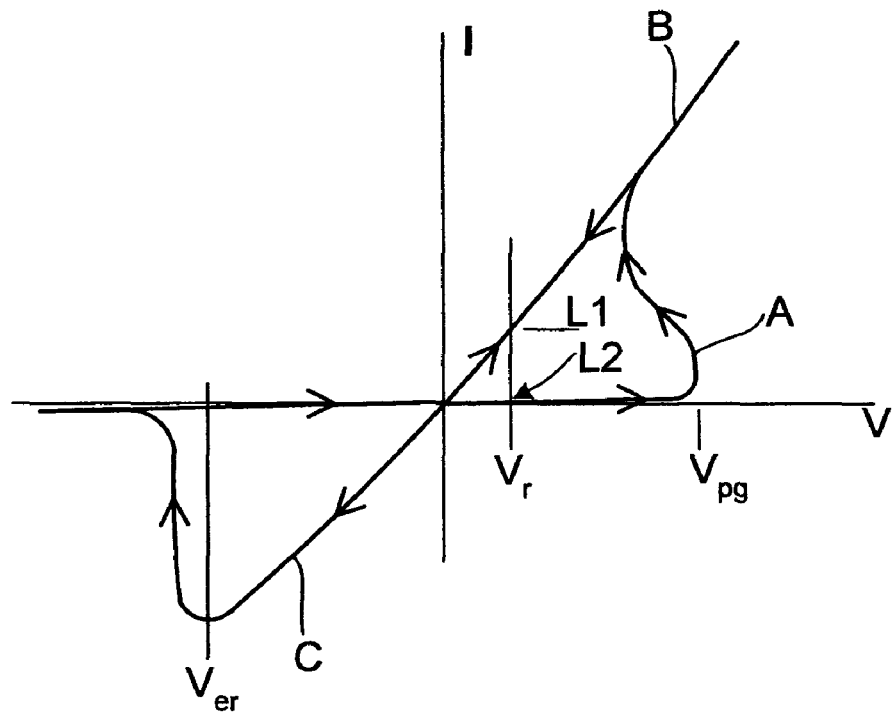
FIG. 2 is a plot of current vs. voltage in the programming, erasing, and reading of the memory device of FIG. 1.
Figure 3:
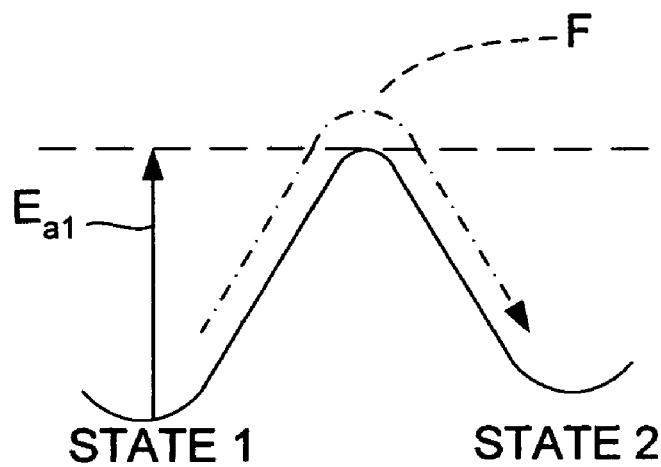
FIGS. 3 and 4 are graphs illustrating activation energy of the device of FIG. 1.
Figure 7:
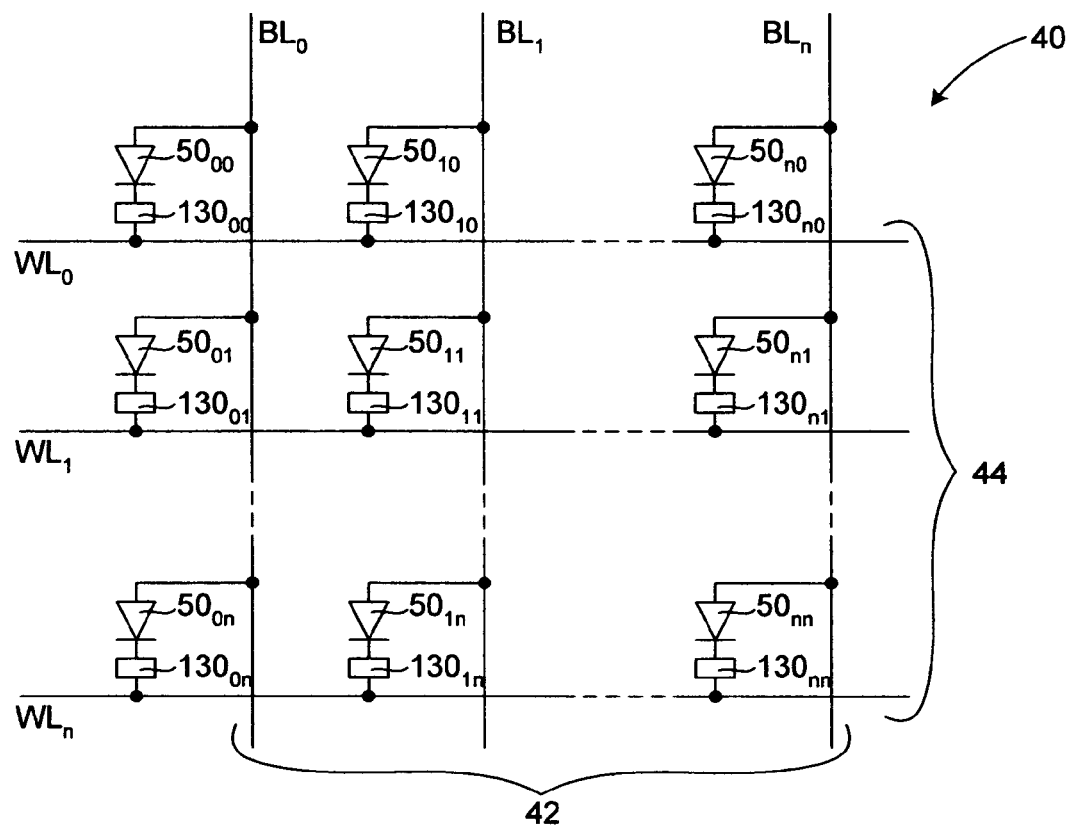
FIG. 7 is a schematic illustration of a memory array incorporating the invention of FIG. 5.

FIG. 7 illustrates a memory cell array 40 which incorporates memory cells 30 of the type described above. As illustrated in FIG. 7, the memory cell array 40 includes a first plurality 42 of parallel conductors (bit lines) $BL_0$, $BL_1$, . . . $BL_n$, and a second plurality 44 of parallel conductors (word lines) $WL_0$, $WL_1$, . . . $WL_n$ overlying and spaced from, orthogonal to, and crossing the first plurality of conductors 42. A plurality of memory cells 30 of the type described above are included, each associated with a select diode 50 having a (forward) threshold $V_t$ and a (reverse) breakdown voltage $V_b$, to form a memory cell-diode structure. Each memory cell 30 is connected in series with a select diode 50 between a conductor BL of the first plurality 42 thereof and a conductor WL of the second plurality 44 thereof at the intersection of those conductors, with the diode 50 oriented in a forward direction from the conductor BL of the first plurality 42 thereof to the conductor WL of the second plurality 44 thereof. For example, as shown in FIG. 3, memory cell $30_{00}$ and diode $50_{00}$ in series connect conductor $BL_0$ of the first plurality of conductors 42 with conductor $WL_0$ of the second plurality of conductors 44 at the intersection of those conductors $BL_0$, $WL_0$, memory cell 30$_{10}$ and diode 50$_{10}$ in series connect conductor $BL_1$ of the first plurality of conductors 42 with conductor $WL_0$ of the second plurality of conductors 44 at the intersection of those conductors $BL_1$, $WL_0$, etc. (it will be understood that select transistors may be used in place of the select diodes 50). Individual memory cells 30 may be programmed and read by applying appropriate voltages to the associated bit lines and word lines.

It will be seen that herein is provided an approach wherein rapid programming of a memory device is achieved, meanwhile with it being insured that the programmed state of the memory device retains its programmed state in a highly stable manner, i.e., with minimal degradation. This results in a programmed memory device which can be read many times over a long period of time, adding to the operational efficiency of the memory structure made up of such memory devices.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of undertaking an operation on a memory device, the memory device comprising first and second electrodes, a passive layer between the first and second electrodes, and an active layer between the first and second electrodes, wherein the memory device may be programmed by providing a charged species from the passive layer into the active layer, wherein the memory device may be programmed to have for the programmed memory device a first erase activation energy, the method comprising providing for the programmed memory device a second erase activation energy greater than the first erase activation energy.

2. The method of claim 1 wherein the step of providing the second erase activation energy greater than the first erase activation energy comprises applying an electrical potential to the memory device.

3. A method of programming a memory device, the memory device comprising first and second electrodes, a passive layer between the first and second electrodes, and an active layer between the first and second electrodes, wherein the memory device may be programmed by applying a required electrical potential to the memory device, the method comprising programming the memory device by applying an electrical potential to the memory device which is substantially greater than the required electrical potential.

* * * * *